US012492474B2

(12) United States Patent
Spencer, II et al.

(10) Patent No.: US 12,492,474 B2
(45) Date of Patent: Dec. 9, 2025

(54) CONTINUOUS SPATIAL ATOMIC LAYER DEPOSITION PROCESS AND APPARATUS FOR APPLYING FILMS ON PARTICLES

(71) Applicant: Forge Nano Inc., Thornton, CO (US)

(72) Inventors: Joseph Allen Spencer, II, Longmont, CO (US); Robert A. Hall, Denver, CO (US)

(73) Assignee: Forge Nano Inc., Thornton, CO (US)

( * ) Notice: Subject to any disclaimer, the term of this patent is extended or adjusted under 35 U.S.C. 154(b) by 0 days.

(21) Appl. No.: 18/463,981

(22) Filed: Sep. 8, 2023

(65) Prior Publication Data

US 2023/0416914 A1 Dec. 28, 2023

Related U.S. Application Data

(63) Continuation of application No. 15/737,023, filed as application No. PCT/US2016/037432 on Jun. 14, 2016, now Pat. No. 11,773,487.

(60) Provisional application No. 62/175,964, filed on Jun. 15, 2015.

(51) Int. Cl.

| | |
|---|---|
| ***C23C 16/455*** | (2006.01) |
| ***C23C 16/44*** | (2006.01) |
| ***C23C 16/442*** | (2006.01) |
| ***C23C 16/458*** | (2006.01) |
| ***C23C 16/54*** | (2006.01) |

(52) U.S. Cl.

CPC .... *C23C 16/45551* (2013.01); *C23C 16/4417* (2013.01); *C23C 16/442* (2013.01); *C23C 16/45555* (2013.01); *C23C 16/54* (2013.01); *C23C 16/4408* (2013.01); *C23C 16/45504* (2013.01); *C23C 16/458* (2013.01)

(58) Field of Classification Search

CPC .............. C23C 16/4417; C23C 16/442; C23C 16/45551; C23C 16/45555; C23C 16/4408; C23C 16/45504; C23C 16/45854

See application file for complete search history.

(56) References Cited

U.S. PATENT DOCUMENTS

| | | | |
|---|---|---|---|
| 4,548,138 | A | 10/1985 | Korenberg |
| 4,715,316 | A | 12/1987 | Broomfield |
| 6,281,098 | B1 | 8/2001 | Wang et al. |
| 9,840,775 | B2 | 12/2017 | Kostamo |

(Continued)

FOREIGN PATENT DOCUMENTS

| | | | |
|---|---|---|---|
| EP | 2520361 | A1 | 11/2012 |
| KR | 101310556 | B1 | 9/2013 |
| WO | 2014167141 | A1 | 10/2014 |

OTHER PUBLICATIONS

Fotou, George P. et al., "Sequential Gas-Phase Formation of Al2O3 and Si02 Layers on Aerosol-Made Ti02 Particles", Adv. Mater. 9, No. 5 (1997) 420-423.

(Continued)

*Primary Examiner* — Michael P Wieczorek
(74) *Attorney, Agent, or Firm* — Frank Rosenberg

(57) ABSTRACT

Continuous spatial atomic layer deposition is performed on a particulate substrate in a continuous reactor comprising a plurality of spatially separated, precursor dosing zones and a means for moving the particulate substrate spatially through the precursor dosing zones to apply an atomic layer deposition coating thereon. The precursor dosing zones may be used simultaneously.

19 Claims, 5 Drawing Sheets

(56) References Cited

U.S. PATENT DOCUMENTS

| | | | |
|---|---|---|---|
| 2003/0059615 | A1 | 3/2003 | Klinedinst et al. |
| 2004/0131791 | A1 | 7/2004 | Torben-Walter et al. |
| 2005/0084610 | A1 | 4/2005 | Selitser |
| 2008/0305646 | A1 | 12/2008 | Yu et al. |
| 2009/0304920 | A1 | 12/2009 | Elam et al. |
| 2011/0200822 | A1 | 8/2011 | Detavernier |
| 2011/0236575 | A1* | 9/2011 | King ................. C23C 16/45555 118/712 |
| 2012/0009343 | A1 | 1/2012 | Van Ommen |
| 2012/0085284 | A1 | 4/2012 | Dassel |
| 2013/0052346 | A1 | 2/2013 | Higashi et al. |
| 2014/0044887 | A1 | 2/2014 | Vermeer |
| 2015/0031157 | A1 | 1/2015 | Elam et al. |
| 2015/0075429 | A1 | 3/2015 | Park et al. |

OTHER PUBLICATIONS

Van Ommen, J. R., et al. “Continuous production of nanostructured particles using spatial atomic layer deposition”, Journal of Vacuum Science & Technology A: Vacuum, Surfaces, and Films, 33(2) (2015) 021513.

Tenou, E et al., “Batch and continuous fluid bed coating—review and state of the art”, Journal of Food Engineering 53 (2002) 325-340.

Machine Translation of KR 101310556 B1.

Extended European Search Report Nov. 16, 2018 for EP Application 16812256.2.

Office Action in EP Application 16812256.2 dated Apr. 13, 2021.

International Preliminary Report on Patentability Chapter I for PCT/US2016/037432 dated Dec. 19, 2017.

Written Opinion of the International Search Authority from International Application No. PCT/US2016/037432 dated Aug. 1, 2016.

International Search Report from International Application No. PCT/US2016/037432 dated Aug. 1, 2016.

* cited by examiner

CONTINUOUS SPATIAL ATOMIC LAYER DEPOSITION PROCESS AND APPARATUS FOR APPLYING FILMS ON PARTICLES

RELATED APPLICATIONS

This application is a continuation of U.S. patent application Ser. No. 15/737,023, filed on Dec. 15, 2017 which claims priority to International Application No. PCT/US16/37432, filed on Jun. 14, 2016 which claims the benefit of U.S. Provisional Patent Application No. 62/175,964, filed on Jun. 15, 2015, the teachings of which are incorporated herein by reference.

TECHNICAL FIELD

This invention relates to an apparatus and methods for applying an atomic layer deposition layer to a particulate substrate.

CROSS-REFERENCES TO RELATED APPLICATIONS

This application claims priority to U.S. Provisional Patent Application No. 62/175,964, filed on Jun. 15, 2015, the teachings of which are incorporated herein by reference.

BACKGROUND OF THE INVENTION

A goal of atomic layer deposition (ALD) is to deposit, monolayer by monolayer, conformal coating layers on a substrate surface. This can be achieved because classic ALD generally comprises two self-limiting half-reactions, each half-reaction producing a single monolayer of precursor molecules on the substrate surface until the surface is "saturated" or completely coated.

In classic or conventional ALD, the half-reactions are separated sequentially by time-sequenced, alternate dosing of each precursor. This time-sequenced, alternate dosing greatly limits the growth rate of the coating because, between each precursor gas dosing, the reaction vessel must be purged by an "inert" gas and pumped out in order to remove any remaining reactive gas and to prevent any chemical vapor deposition process (CVD) from occurring. The purging and subsequent pumping times limit the growth rate and render this time-sequenced alternate dosing process impractical for high-throughput manufacturing.

A fluidized, vibrating bed reactor is a large scale commercial piece of equipment in the powder handling industry, typically used for drying applications. ALD on particles is commonly performed in a fluidized bed or rotating bed, but typically in a batch system. However, to attain production levels of ALD coatings in the hundreds of kilograms per hour, a continuous process, rather than a batch process, is needed. To date, techniques for continuous ALD particle manufacturing involve newly-designed and untested equipment, which is adapted to deposit coatings on a surface of only a relatively large substrate. There has been an on-going need for a high through-put, continuous spatial atomic layer deposition process and apparatus for coating particles.

SUMMARY OF THE INVENTION

Disclosed herein are a device and a method for performing spatial atomic layer deposition (ALD) and/or chemical vapor deposition (CVD) in a real time, continuous manner in both dosing and purging sections of the device. In spatial ALD, the precursor dosing is separated in space instead of being separated in time. Spatially separating the half-reactions eliminates the time-consuming pumping steps required in time-sequenced dosing. In contrast to currently available time-sequenced alternate dosing methods and equipment, the disclosed continuous method and apparatus for ALD and CVD are useful for large scale, rapid production of coated particles, e.g., for use as catalysts, catalyst supports, sintering aids, electrochemical precursor materials, air stable metal particles, advanced composite thermal management materials, phosphors, pigments, filler materials, and for enhanced processability.

In one embodiment the invention is a continuous reactor configured for performing continuous spatial atomic layer deposition or chemical vapor deposition on a particulate substrate, the continuous reactor comprising: a plurality of spatially separated, precursor dosing zones, and a means for moving the particulate substrate spatially through the precursor dosing zones to apply an atomic layer deposition coating or a chemical vapor deposition thereon.

The disclosed atomic layer deposition and chemical vapor deposition (CVD) process and device are for use in applying a coating onto a substrate, for example, a particulate substrate. The disclosed spatial ALD and/or CVD system, provides significantly higher throughput than that of currently available, time-sequenced dosing systems, and can be operated in a continuous manner. Particles of the substrate are directed through a reaction zone that includes at least one separate precursor dosing zone, a head space above the particles for collecting exhaust gas, and means for removing exhaust gas from the head space. A precursor gas is introduced into contact with the directed particles at each precursor dosing zone, such that the precursor gas reacts at the surface of the particles in said precursor dosing zone. An exhaust gas is collected from the head space containing at least one of the following: a purge gas, a carrier gas, unreacted precursor and a reaction by-product. The exhaust gas is removed from the head space.

Also disclosed herein is an apparatus for performing atomic layer deposition or chemical vapor deposition on a particulate substrate comprising: a reaction zone that includes one or more spatially separated, precursor dosing zones wherein each includes dosing means for introducing a precursor gas into the reaction zone, and a head space above the particulate substrate for collecting exhaust gas from said zone, and means for removing exhaust gas from the head space; and a particle transport means for directing the particulate substrate through the precursor dosing zones of the reaction zone such that the particulate substrate disposed on the particle transport means can move through each dosing zone and is contacted in each dosing zone with the precursor gas introduced by the dosing means in said respective dosing zone.

One embodiment of the disclosed apparatus includes spatially separated, precursor dosing zones that operate simultaneously. Another embodiment of the disclosed apparatus includes an operation mode that is continuous.

Yet another embodiment of the disclosed invention is a method of atomic layer deposition or of chemical vapor deposition for applying a coating onto a plurality of particles in a particulate substrate, comprising: a) directing the plurality of particles of the substrate through a reaction zone in a reactor apparatus that includes at least one spatially separated precursor dosing zone, a head space above the directed particles for collecting exhaust gas, and means for removing the exhaust gas from the head space; b) introducing a precursor gas into contact with the directed particles at each precursor dosing zone, such that the precursor gas reacts at the surface of the directed particles in said precursor dosing zone to form a particulate substrate with an atomic layer deposition or a chemical vapor deposition thereon said plurality of particles; c) collecting an exhaust gas from the head space containing at least one of the following: a purge gas, a carrier gas, unreacted precursor and a reaction by-product; d) removing the exhaust gas from the head space; and e} removing the particulate substrate with an atomic layer deposition or a chemical vapor deposition thereon said plurality of particles from the reaction zone.

The disclosed method can be performed in a continuous manner.

DETAILED DESCRIPTION OF THE PREFERRED EMBODIMENTS

A continuous reactor, also referred to as a flow reactor, is one in which materials continuously enter the reactor and from which a continuous stream of product is removed. In contrast to a continuous reactor, a batch reactor is generally a stirred tank into which all of the reagents needed are added for a complete batch cycle, after which the products are removed. There is an ongoing need for a high through-put, continuous atomic layer deposition process and apparatus for coating particles.

Figure 1:
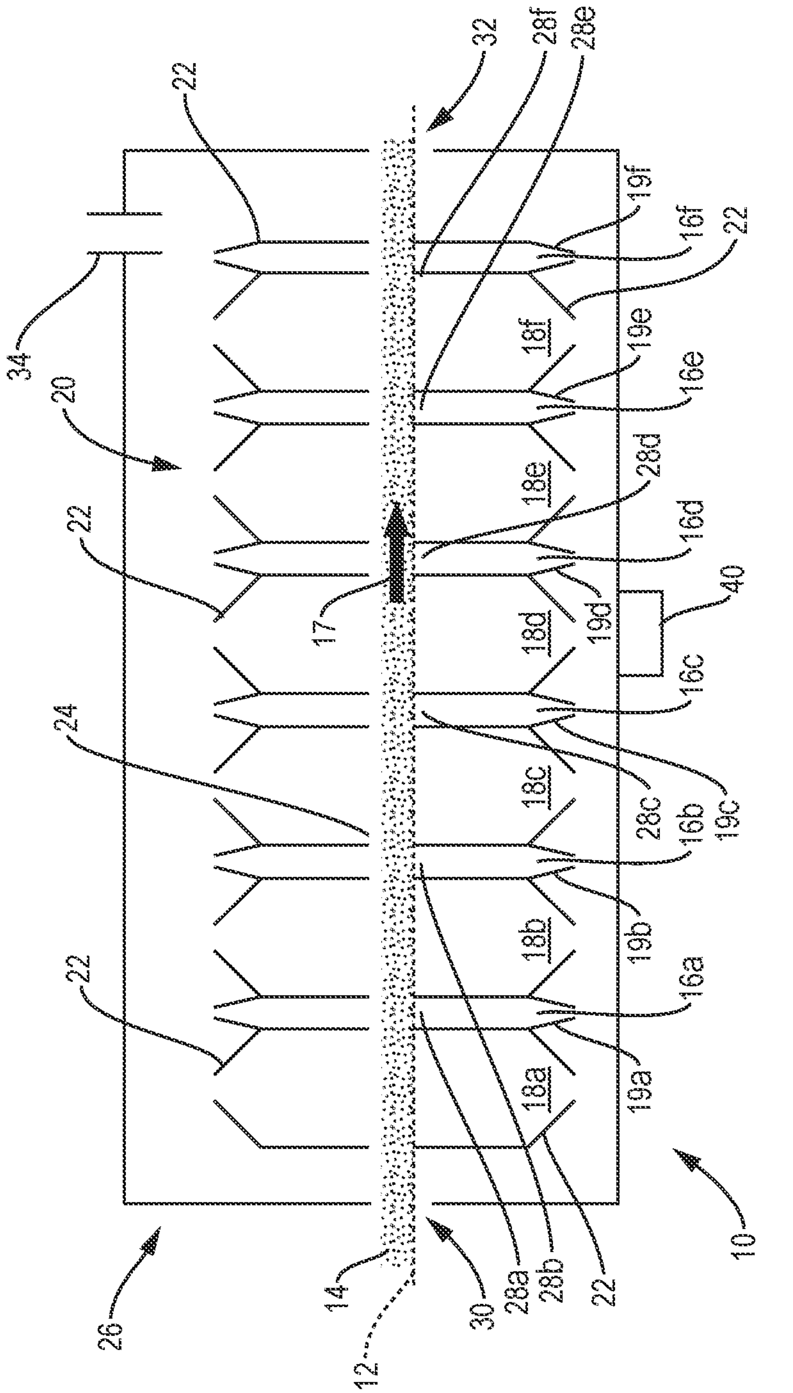
FIG. 1 is a schematic side view diagram of an embodiment of an apparatus of the invention having a linear orientation.

FIG. 1 is a schematic diagram of an embodiment of an apparatus of the invention. Apparatus 10 for performing continuous spatial atomic layer deposition includes reaction zone 26. Disposed within reaction zone 26 are multiple precursor dosing zones 28*a*-28*f*. Within each precursor dosing zone 28*a*-28*f* there are dosing means 16*a*-16*f*, respectively, for providing a precursor gas and contacting the gas with powder bed 14. Powder bed 14 is a mass of substrate particles. As the terms are used herein, "substrate particles bed" is synonymous with "powder bed." In one embodiment, powder bed 14 moves continuously in, through, and out of reaction zone 26, spatially exposing the substrate particles bed or powder bed 14 to precursor gas in precursor zones 28*a* through 28*f*.

In the embodiment shown, powder bed 14 is supported by particle support 12, which forms part of the particle transport means, or particle moving means. The particle transport means in general will include a holder or support for the particles, such as particle support 12, together with apparatus that conveys the powder and/or the particle support 12 containing the powder or substrate particles in, through, and out of the reaction zone 26. Thus, powder bed 14 is moved in, through and out of reaction zone 26 by moving particle support 12, by moving powder bed 14 along a stationary particle support 12, or by some combination thereof. In one embodiment of the invention, particle support 12 is stationary. In other embodiments, particle support 12 is moving in a translational mode or in a vibrational mode.

Thus, for example, in some embodiments particle support 12 is a porous plate, tube, trough or tray that has pores to allow precursor gas introduced in dosing zones 28*a*-28*f* to pass through particle support 12 and contact powder bed 14. The pores may be smaller than the substrate particles in powder bed 14 so the substrate particles remain supported by particle support 12.

In some embodiments, particle support 12 moves through reaction zone 26, carrying the substrate particles in powder bed 14 sequentially past precursor dosing zones 28*a*-28*f*, where the substrate particles are sequentially dosed with precursor gas introduced at each of said dosing zones. In such embodiments, apparatus 10 will include means, such as motors, guidance systems, gearing and control mechanisms (not shown) to effect such movement of particle support 12.

In alternative embodiments, particle support 12 is stationary and may be of various geometry; and means are provided to move the substrate particles of particle bed 14 through reaction zone 26. Such means may include, for example, screw or paddle feeding systems, various types of spiral conveyors, vibrating conveyers, and the like, for moving the substrate particles in, through and out of reaction zone 26. Particle support 12 may be inclined and vibrated, so the substrate particles are moved through reaction zone 26 under the force of gravity.

A preferred means of transporting the substrate particles is a moveable or vibrating porous support that transports the substrate particles through reaction zone 26. Such a support may be made of any type of perforated or modified perforated material that can withstand the conditions of the atomic layer deposition reactions. Non-limiting examples of a suitable support include woven wire, drilled plate, stamped plated, directional punched plates, or a plate with perforations and measures to prevent material from falling through the plate, such as bubble caps or tuyeres or nozzels. A porous support may or may not have a structural under-support. A porous support may have unperforated sections for conveying the particles only, with no gas flow.

Particle support 12 may be vibrated during operation to enhance exposure of the particles to the precursor gases.

During operation, a continuous movement of substrate particles in powder bed 14 traveling into, through, and out of reaction zone 26 is established. In FIG. 1, this movement is from left to right. Substrate particles entering entrance end 30 of reaction zone 26 pass, through space, inert gas dosing zone 18*a*, precursor dosing zone 28*a*, inert gas dosing zone 18*b*, precursor dosing zone 28*b*, inert gas dosing zone 18*c* precursor dosing zone 28*c*, inert gas dosing zone 18*d*, precursor dosing zone 28*d*, inert gas dosing zone 18*e*, precursor dosing zone 28*e*, inert gas dosing zone 18*f* and precursor dosing zone 28*f*, before exiting through exit 32 of reaction zone 26.

At each precursor dosing zone 28*a*-28*f*, a precursor gas, supplied via corresponding dosing means, contacts powder bed 14 and reacts at the surface of the substrate particles. The reaction is self-limiting, in that in each instance, the precursor gas cannot react with itself under the conditions of the reaction, and therefore the extent of reaction is limited by the number of functional groups on the substrate particles that are available to react with the precursor.

The number of precursor dosing zones is arbitrarily shown as six in FIG. 1, although any greater or smaller number of dosing zones can be present.

The dosing means include an apparatus for dispensing a precursor gas into the corresponding dosing zone. Such apparatus may include, for example, one or more conduits that deliver the precursor to the precursor dosing zones 28*a*-28*f*, one or more dispensing heads through which the precursor is dispensed form the dosing apparatus into the dosing zone, and various storage, metering and pumping equipment. Dosing may also occur just above the particle support 12 such that precursors sufficiently contact the powder bed 14 to react.

The atomic layer deposition reaction in general requires the alternating reaction of two or more precursor gases at the surface of the substrate particles. The overall reaction that forms the coating material on the substrate particles is divided into two or more part-reactions, each of which involves one precursor. The completion of all the needed part-reactions results in the formation of the coating material. Therefore, typically at least two different precursor gases are provided in the various precursor dosing zones 28*a*-28*f*. In a preferred embodiment, the precursor gases are provided to the particles in an alternating pattern at the precursor dosing zones 28*a*-28*f*. If exactly two precursors are needed to complete an ALD reaction cycle, those precursors may be provided in an alternating A-purge-, B-purge-, A-purge-, B-purge type spatial arrangement, wherein A represents the first of the precursors and B represents the second precursor. Thus, precursor A can be dosed in precursor dosing zones 28*a*, 28*c* and 28*e*, and precursor B can be dosed in precursor dosing zones 28*b*, 28*d* and 28*f*, to establish the A-purge-B-purge-A-purge-B-purge pattern. If three precursors are needed to complete a cycle, they can be provided in an A-purge-B-purge-C-purge-A-purge-B-purge-C-purge sequence, in which precursor A is provided at precursor dosing zones 28*a* and 28*d*, precursor B is provided at precursor dosing zones 28*b* and 28*e* and precursor C is provided at precursor dosing zones 28*c* and 28*f*. In another embodiment of the invention, the ALD cycle can also be completed outside of the reactor using ambient gas concentrations in the earth's atmosphere. Water found in humid air functions as a precursor in many ALD chemistries. In this instance, only one precursor gas ALD dosing zone is necessary for the last cycle. In another embodiment, the no purge zones are used and precursors are located adjacent to one another, which may result in a more chemical vapor deposit (CVD)-like coating.

A typical ALD chemistry utilizes trimethylaluminum (TMA) and water vapor, the water vapor either as an added purge gas or present in ambient air to which a substrate is alternately exposed. Yet another embodiment of the invention comprises a series of multiple "half-cycle TMA reactors" that are arranged such that the substrate material is exposed to TMA; then exits the disclosed reactor; then is exposed to water vapor in ambient air; then enters another TMA reactor; then exits and is exposed to water vapor in ambient air. This process is repeated a sufficient number of times to produce an ALD film on the substrate particles.

The various precursors may be contained in a carrier gas to assist in transporting the precursor into contact with the substrate particles and to control dosages.

The reactions of the various precursors with the substrate particles often produce a gaseous reaction by-product which generally should be removed in each case before the next sequential precursor is contacted with the substrate particles. An exhaust gas containing these by-products, as well as a carrier or purge gas (if any), and/or unreacted precursor, are collected in head space 20 and then removed from head space 20 and reaction zone 26. Various types of gas handling systems for collecting and removing such gases are useful. Exhaust gases from the various precursor dosing zones can be removed separately, or can be combined and removed together.

In the present embodiment shown, head space 20 is common to the various precursor dosing zones 28*a*-28*f* and optional purge gas dosing zones 18*a*-18*f*. By "common", it is meant that the head spaces above the various precursor dosing zones (and purge zones, if present) are in fluid communication with each other, so exhaust gases from the various zones can become combined. The flow of exhaust gases from the various zones can be directed somewhat without complete isolation, as shown in FIG. 1. In the embodiment shown in FIG. 1, baffles 22 largely but not completely separate exhaust gases from the various precursor dosing zones 28*a*-28*f* from each other as well as from the option purge gas dosing zones 18*a*-18*f*. Openings 24 permit fluid communication between adjacent zones, and in addition the various zones are in fluid communication at the top of head space 20, above baffles 22. This baffling minimizes chemical vapor deposition reactions between unreacted precursors in head space 20, while permitting pressures to be balanced within the various sections created in head space 20 by baffles 22. Gases within the head space 20 exits apparatus 10 through vent 34.

Baffles 22 can be added above the bed to create separate zones of gases and provide direction for purging. Vacuum ports can be installed within head space 20 to allow withdrawal of exhaust gases from precursor zones 28*a*-28*f*.

Optional purge gas dosing zones 18*a*-18*f* include purge gas dosing means, such as described with respect to the precursor dosing means, for introducing a purge gas into the respective zones. The purge gas serves to remove residual unreacted precursor and/or reaction by-products from particle bed 14. The purge gas may be a gas or mixture of gases that does not participate in the ALD reaction. It may be, for example, an inert gas such as nitrogen, helium or argon, or can be air or other convenient gas. The purge gas in some embodiments may contain radicals and/or catalytic materials that promote the atomic layer deposition reactions.

Although FIG. 1 illustrates a linear orientation, various alternative geometries can be used to reduce the footprint required to conduct many cycles. Multiple units can be used in a tiered fashion. For example, two or more reactors can be "stacked" with alternating reactor direction. Material is to be fed into one reactor for a number of ALD cycles, then falls into the next reactor for additional cycles. Alternatively, the apparatus can be designed so the substrate particles follow a circular or spiral path. Thus, the substrate material could be fed into a series of stacked circular trays designed to have powder cascade from one level to another. Baffles tend to form a minimum depth of powder in each tray, and help separate gases. One or more ALD cycles is performed in each tray, with purge trays optionally positioned in between.

Other possible arrangements include a spiral conveyor and a radial spiral design. In a radial spiral design, substrate material particles are fed into the center of a flat reactor with a spiral baffle. The spiral baffle directs the material from the center of the reactor circularly around the reactor until it exits after a number of circulations. Precursor dozing zones are arranged around the spiral to perform ALD cycles and purges while a vibrating motor or other device conveys the material.

After passing through the apparatus, the coated particles are collected in a hopper or other collection apparatus. In some embodiments, atmospheric water, carbon dioxide, carbon monoxide or other compound present in air can be one of the precursor materials. It is within the scope of the invention to perform the last contacting of the substrate with such an air-borne precursor after the particles have exited the reaction zone, in such a hopper or other collection apparatus.

Figure 2:
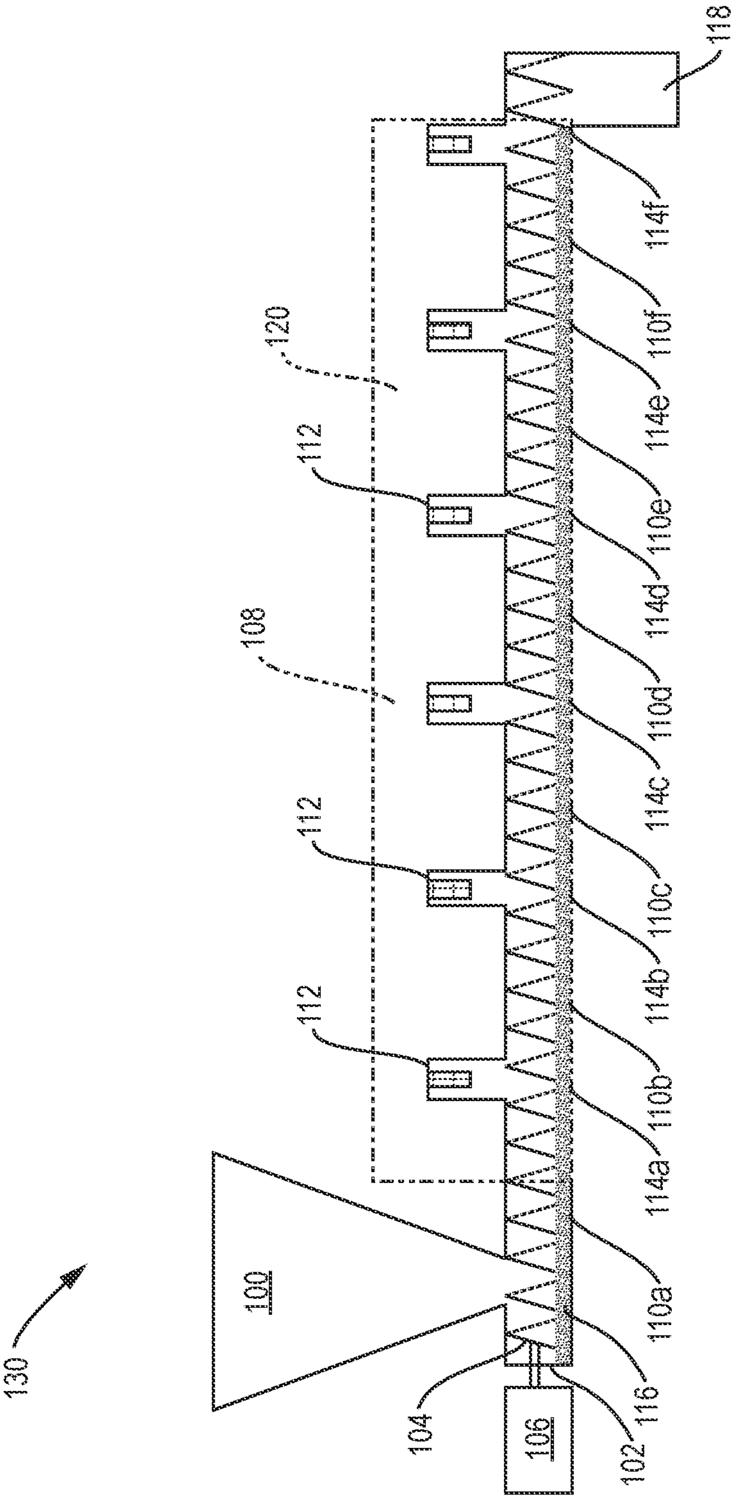
FIG. 2 is a schematic side view diagram of another embodiment of the apparatus of the invention.
Figure 3:
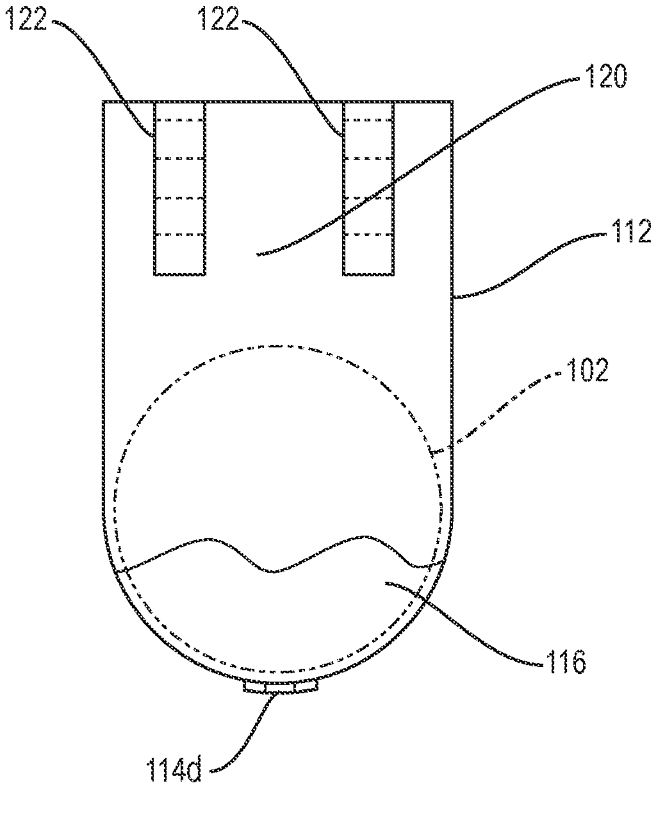
FIG. 3 a cross-sectional view schematic diagram of the embodiment shown in FIG. 2.

FIG. 2 and FIG. 3 illustrate another embodiment of the invention. FIG. 2 is a schematic side view diagram of another embodiment of the apparatus. FIG. 3 is an expanded cross-sectional view a portion of the schematic diagram of the same apparatus shown in FIG. 2.

In FIG. 2, a schematic representation of an apparatus 130 according to an embodiment of the invention is shown. The particle transport means includes a trough or tube 102 with integrated porous section, longitudinal screw 104, and motor 106 for driving screw 104 to push powder 116 through trough 102 with porous section. Hopper 100 holds the starting substrate particles and feeds them into trough 102 with porous section. As the particles traverse the length of trough 102 with porous section, the particles are exposed in reaction zone 108 to purge gases in zones **110*a*-110*f*, and precursors in precursor dosing zones 114*a*-114*f*. The dosing in the various zones is spatial in the order indicated from left to right in FIG. 2. ALD-coated particles are collected in product hopper 118 at the end of trough 102 with porous section. Purge and precursor gases enter trough 102 with porous section and react at the surfaces of the substrate particles. Exhaust gas exits trough 102 with porous section into ports 112 which have head space 120, and are removed via exhaust gas outlets 122**.

The substrate particles may be of any material that is chemically and thermally stable under the conditions of the ALD or, in some cases, the CVD reaction. Non-limiting examples include ceramic materials, metals, organic polymers, and silicon. The substrate particles may have a particle size of from about 25 nanometers (nm) to, for example, 100 millimeters (mm) or even larger. Particle sizes in this context refer to the diameter of a sphere having an equivalent volume, and can be measured directly on larger particles, using sieving methods or light scattering methods (for particles 50 micrometers (μm) or smaller). In some embodiments, the particle size is 100 nm to 25 μm.

Suitable methods and precursor materials for producing films via atomic layer deposition processes are described, for example, in U.S. Pat. Nos. 6,613,383; 6,713,177; 6,913,827; 6,958,174; and 8,900,761; in International Publications WO 03/008110 and WO 03/008186A1; in U.S. Published Patent Application Nos. 2004/0194691 and 2004/0224087; and by Kim et al., *Thin Solid Films* 2000, 372, 276; Elam et al., *Thin Solid Films* 2003, 436, 145; and Klaus et al. *Surface Science* 1998, 418, L14.

In some embodiments of the invention, reaction conditions are selected mainly to meet two criteria. The first criterion is that the reagents are gaseous under the conditions of the reaction. Therefore, temperature and pressure conditions are selected such that the reactants are volatilized. The reactions are generally performed at elevated temperatures, preferably from about 400K to 1,000K, although in some instances reaction temperatures as low at approximately 290K can be used. The second criterion is one of reactivity. Conditions, particularly temperature, are selected such that the desired reaction between the film-forming reagents (or, at the start of the reaction, the first-introduced reagent and the particle surface) occurs at a commercially reasonable rate.

Operating pressures can be atmospheric or sub-atmospheric, as desired or necessary for the particular ALD reactions being performed.

The number of reaction cycles, and thus the number of precursor dosing zones needed, depends on the desired coating thickness. The number of precursor dosing zones may be as few as one ambient condition or as many as a thousand or more. The number of reaction cycles may be, for example, as few as one and as many as 500. The average thickness of the applied coating may be, for example, from 0.1 nm to 100 nm or more. If necessary, the substrate particles may be passed through the apparatus multiple times to obtain the desired coating thickness.

Contemporary ALD batch reactors, for example, fluidized, rotary, etc., separate precursors temporally, that is, limited as to time, which simplifies the gas dynamics of the system. Unfortunately, this style of system requires a batch system design, which requires separate heating, drying, and processing steps for each batch run. The disclosed continuous, vibrating reactor (CVR) mitigates these problems by separating the precursors spatially, which spatial separation naturally allows a fully continuous production tool to ensure an ALD coating by means of gas flow manifold/balancing, particle translation, and gas evacuation. The spatial arrangement of the precursors allows for proper ALD and prevents Chemical Vapor Deposition (CVD) reactions at the particle surface. The disclosed device provides a capability for multi-ton per day throughput.

Figure 4:
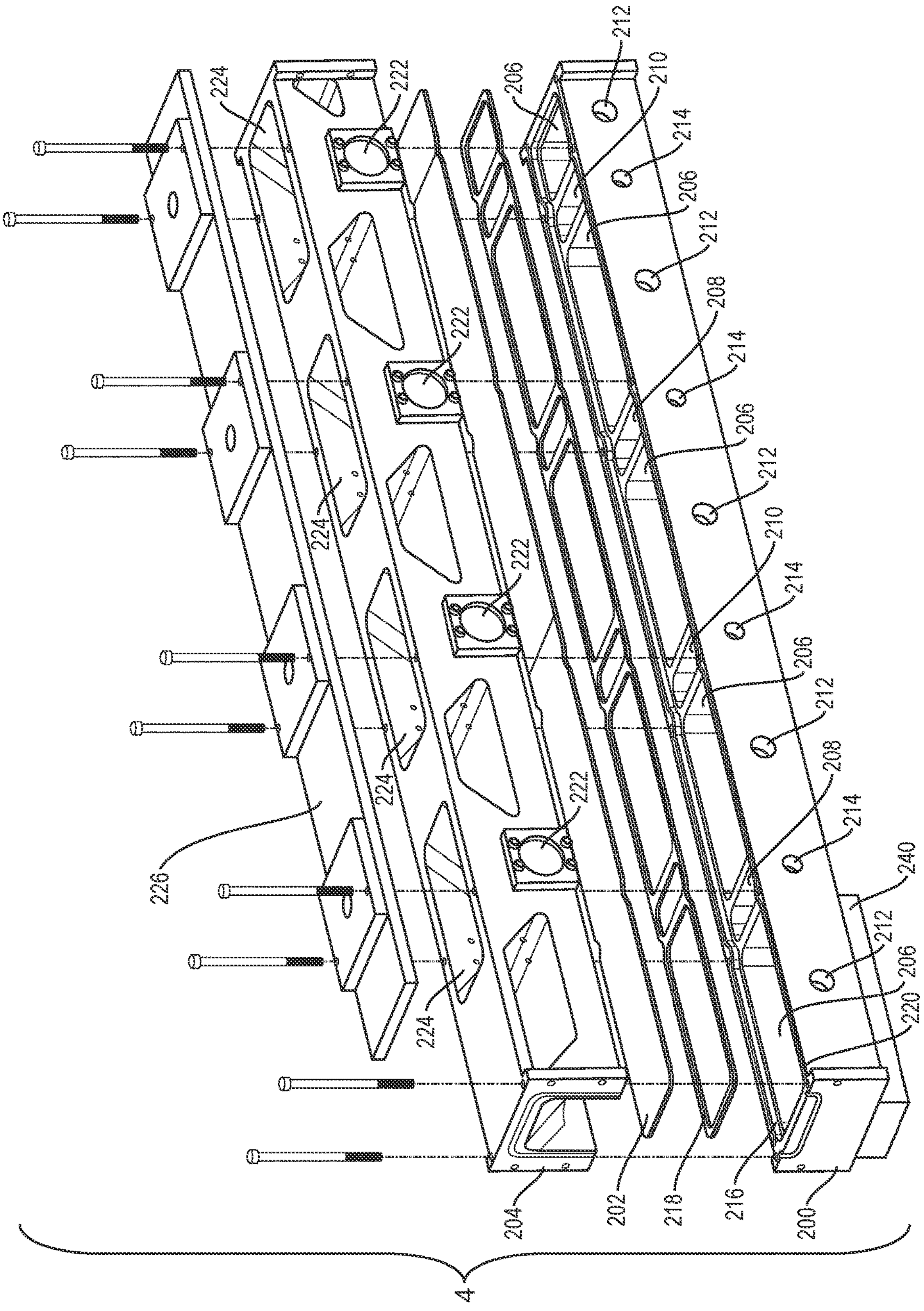
FIG. 4 is an exploded diagram of another embodiment of an apparatus of the invention.

FIG. 4 shows an exploded diagram of a miniature continuous ALD reactor. The three main components include a gas delivery chamber 200, a porous, woven, or perforated plate (deck) 202 for conveying gas through and particles across, and a gas exhaust partition 204. In one embodiment, the reactor is constructed from stainless steel 304 to provide a uniform temperature when heating, and allows for rapid cleaning with sodium hydroxide solution. The gas is delivered through separate chambers. In operation, particles are conveyed left to right in the diagram. The first zone traversed by the particles is an inert gas chamber 206 having gas inlet connection 212 for receiving inert gas. The first inert gas chamber 206 is approximately 10.8 cm (4.25 inches) in length which purges the surface of the substrate powder and prevents oxygen and water ingress into the system from the particle entrance. Precursor A is delivered next into a precursor A dose chamber 208, which is a separate compartment from the inert gas chamber 206. In one embodiment, the wall is made from stainless steel and can be about 6.35 mm (0.25 inches) thick while the chamber itself is about 19.05 mm (0.75 inches) in length.

Precursor A dose chamber 208 having precursor gas inlet connection 214 for receiving precursor A dose gas is followed by second inert chamber 206 to provide separation and inert gas purging of the particles on the deck 202 between the spaces directly above precursor A dose chamber 208 and precursor B dose chamber 210. Precursor B dose chamber 210 can have the same dimensions as precursor A dose chamber 208. These four chambers (two purge chambers and two dose chambers) allow one full atomic layer deposition cycle to take place above the deck 202 through which the particle substrate translates. This pattern can be repeated for the desired number of cycles to coat, and can be scaled in any dimension to accommodate different coating requirements, such as increase exposures or material capacities. The embodiment shown in FIG. 4 demonstrates two complete ALD cycles.

The particles are conveyed across a five-micron porous sheet particle deck 202 that allows gas to pass through while ensuring that the particles cannot become embedded or fall through the deck. It fits into a seal recess 216 and is in contact with seal 218 formed of a synthetic rubber and/or fluoropolymer elastomer, aluminum, copper, or other suitable gasket material. This ensures that when gases are forced through the porous sheet, they do not contact each other underneath the deck, causing CVD. Outer chamber seal 220 ensures that gases do not escape to the outer portion of the apparatus.

Gas delivery chamber 200, plate for conveying gas through and particles across 202, and gas exhaust partition 204 are stacked together and compressed with bolts to seal the reactor from atmospheric gases. Around the end faces of gas delivery chamber 200 and gas exhaust partition 204 is an O-ring, such as a VITON® (DuPont Performance Elastomers L.L.C.) O-ring, to seal entrance and exit flanges, or concurrently assembled reactor sections. VITON® is a brand of synthetic rubber and fluoropolymer elastomer commonly used in O-rings, chemical-resistant gloves, and other molded or extruded goods.

On the gas exhaust partition 204, there are exhaust ports 224 leading through top plate 226 to an exhaust system not shown. In one embodiment, gas exhaust partition 204 is designed to flair or expand outward above dose chamber 208 causing a drop in the velocity of the gas which allows any entrained particles to fall out of the gas stream. To further minimize particle escape, on exhaust port 224*a* compact porous metal filter (not shown) of 50-micron pore size is attached. The particles can be fed through the reactor at a constant rate using a volumetric screw feeder. The feeder or connection from the feeder to the reactor can be purged with a nonreactive gas. The particles drop or move from the screw feeder into the entrance of the continuous ALD reactor chamber. Mounted on the underside of the reactor is a compressed air or electronic vibration system that oscillates the chamber at a specific frequency and angle allowing the translation of the material from entrance, through the zones, and the exit in ideally a plug flow manner.

For this system to operate optimally, all the purge and reactant gas flows should be balanced and appropriate for the given particle properties and speed of conveyance. Initial calculations are dependent upon the bulk density of particles to coat, surface area of the particles, the substrate linear velocity and the estimated bed height. The appropriate precursor delivery flux is then calculated based upon these parameters and the precursor properties. Precursors are typically delivered by bubbling an inert gas carrier stream, such an $N_2$, through a precursor, thereby saturating the gas with the vapor pressure of the precursor. The fraction of precursor in the gas stream can be controlled by changing the temperature of the precursor, and thus its vapor pressure. It is very important to determine the correct amount of precursor to dose. Additionally, it is important to then calculate the inert gas flow required to keep the two precursors separate. Ideally, the precursors would be used at 100% efficiency, but it is important to keep an inert gas window between precursors.

To start with an example using the ALD chemistry trimethylaluminum (TMA) and water on a standard battery material of lithium nickel manganese cobalt oxide, the material is conveyed at a linear velocity of 2.5 cm/s with a bed height of 0.2 cm. To maintain this speed, the particles are fed in at a rate of 100 mL per minute from the volumetric screw feeder. To substantially uniformly coat the battery material with one cycle, the TMA stream flow requirements are determined, and then used to calculate and balance the gas flows throughout the rest of the system. First, the theoretical mass of TMA consumed to mass of substrate is calculated. Once one has a precursor amount for the TMA, one can determine the volumetric amount of TMA at the reactor temperature per kg of substrate.

Taking the volumetric amount of TMA, the flux through the dose zone needs to be calculated. The tap density of the material is then used to calculate the zone mass and the pressure drop. The zone resident time for the substrate is calculated using the substrate linear velocity and the gas flow area of the zone. Finally, the TMA zone flow rate for a given TMA temperature and vapor pressure is identified in standard liters/min. This volumetric flowrate is controlled using mass flow controllers for the inert gas which flows over the head space of the TMA container.

With the current system configuration, there are three flow manifold systems. The TMA flow manifold system consists of a mass flow controller, gas piping for directing flow over the TMA container, and a distribution manifold to split flows equally to the entrances of the reactor. The flows out of the manifold are balanced to ensure each port receives an equal amount of flow (in the case of a four-cycle system, of the total flow). The flow rate through the TMA precursor bubbler is controlled via the mass flow controller. The amount of flow is set from the calculated TMA zone flow rate multiplied by the number of TMA zones.

The water flow rate is calculated in the same method as for the TMA and the flow rate is typically similar to the trimethylaluminum. The flow is controlled using a mass flow controller, as well. Even though the two flow rates are essentially balanced to react at 100% efficiency, we still need to provide an inert gas curtain to ensure that the preferred direction of flow for any unreacted gases is through the exhaust ports 224.

The gas flow for the gas curtain is set at a higher flow rate than the TMA or water zones to provide a positive pressure and directional flow towards the exit port instead of through the other zones. The exit ports are attached to a negative pressure system that offers a near equal pressure when compared to the pressure above the particle deck 202. This encourages the flow rate to assume a direction from dose chamber 214 entrance to nearest exhaust port 224 exit and not through other zones, which would result in CVD. If the system is open to atmosphere, it is critical to ensure that there is neither a positive or negative pressure from the exit and entrance ports for the substrate. This is accomplished with a differential pressure manometer.

To ensure the substrate is dry as it travels through the reactor zone, the powder is preheated in the volumetric feeder to 80-100° C. in a dry inert atmosphere. The substrate is then fed into the reactor through a flange assembly that is inert gas purged. The substrate enters the reactor which is heated to 180° C. using resistive strip heaters. There are eight resistive heating strips controlled by a proportional integral derivative controller (PID controller) or variable transformer.

Once the substrate has traveled through the reactor, the coated particles drop into a stainless steel containment vessel. The collection vessel is sealed with a filtered exhaust port that ensures there is no gas buildup. The collection vessel is also purged with a slight flow of inert gas. The bottom of the vessel is smooth and contains no weld beads to inhibit particle contamination from batch to batch.

In one embodiment of the disclosed apparatus, wherein the reactor is configured to perform atomic layer deposition or chemical vapor deposition in a continuous manner. In another embodiment, the speed of the particulate substrate through the apparatus can be adjusted to provide increased residence time in the reaction zone and/or at least one of the precursor dosing zones. Further, in some embodiments, the movement of the particulate substrate through the apparatus can be temporarily stopped.

Similarly, one embodiment of the disclosed method of atomic layer deposition or the chemical vapor deposition is performed in a continuous manner. Further, in some embodiments of the method, the speed of the directed particles of the particulate substrate through the reactor apparatus is adjusted to provide increased residence time in the reaction zone, and/or to temporarily stop movement of the directed particles.

Powder Fluidization and Conveyance in Some Embodiments of the Invention:

Disclosed herein are embodiments of the invention wherein the substrate particles or powder is partially or fully fluidized, instead of being simply conveyed. In some embodiments the substrate powder is moved through the force of gravity, for example in a slide, chute, or inclined tube. In yet other embodiments, the substrate powder can be oscillated, from one side of the reactor to the other. An embodiment of the apparatus can use a linear or circular vibrating conveyance mechanism. The vibrational drive direction can also be reversible such that material can be conveyed in either linear direction.

In some embodiments of the invention the flow path is a continuous circle, for example, in a fully circular reactor wherein material is coated in continuous circulation until removed. In some embodiments, the substrate particle flow path is spiral or helical. The disclosed apparatus can be easily modified to an arrangement that allows the powder substrate to descend or rise through spatially separated gas zones.

In one embodiment a feeder is used to recycle exiting material into an inlet for additional coating. Multiple apparatuses can be cascaded, that is, arranged to direct exiting material to be recycled for additional coating.

A disclosed apparatus can include particle flow and/or gas flow control mechanisms, such as baffles, weirs, and holdup gates.

In one embodiment of the apparatus and method, the particle bed depth is operated at less than 1 cm, more preferably less than 3 cm, more preferably less than 1 meter. An apparatus may include a substrate powder feeder, feeding hopper, collection hopper, or attached particle handling equipment, wherein the powder is pretreated, preheated, cooled, dried, surface-treated, exposed to an ALD precursor, or exposed to a non-ALD precursor.

Reactor Operation and Flow Mechanics in Some Embodiments of the Invention:

One embodiment of the invention is an apparatus wherein the exhaust flow is balanced with the incoming gas flow, in order to prevent or minimize chemical reaction from the ingress or egress of gases in the atmosphere outside the apparatus. In another embodiment of the apparatus, the gas flow is controlled in the particle region, preferably to be laminar.

Another embodiment of the apparatus includes redundant gas zones, such that multiple A or B zones are used before the opposite precursor (A-purge-A-purge-B-purge-B-purge). The disclosed apparatus can have an uneven arrangement of dose zones. A disclosed apparatus can include control systems to independently turn on and off precursor delivery to any of the dose chambers. An embodiment of the apparatus can include controls for integrated abatement measures.

The disclosed apparatus may include analysis ports for use in sampling a gas area above or at the powder. The apparatus may include or be operationally associated with a mass spectrometer, an IR spectrometer, or some other analysis technique to determine gas concentration within the reactor.

The disclosed apparatus may include elastomer, welded, or crushed metal gaskets to seal individual dose gas chambers. In some embodiments the apparatus includes or is operationally associated with one or more of IR lamps, conductive heaters, radiant heaters, recirculating oil heaters, or another type of heater to heat the substrate. The apparatus may include integrated exhaust particle filters and/or remotely located exhaust particle filters.

Precursor Related Concepts in Some Embodiments of the Invention:

One embodiment of the invention is an apparatus configured such that precursors enter the powder bed above the support deck, below the support deck, or to the side of the support deck. Another embodiment is an apparatus configured such that the first precursor exposure occurs in the feeder. Yet another embodiment is an apparatus wherein the last precursor exposure occurs in the collection hopper or a cooling tower. A method and apparatus according to an embodiment of the invention provides for the last precursor exposure occurring outside the apparatus.

An embodiment of the invention is an apparatus for performing ALD or CVD onto powdered material that separates two or more reactive gases in space using a non-reactive gas to buffer said reactive gases in order to maximize gas-solid reactions at the surface of the substrate particles.

Also disclosed herein is a method including using a plasma source, ozone source, UV light, or IR light as a precursor or enabling component of the reaction.

The following examples are provided to illustrate the invention, and are not intended to limit the scope thereof. All parts and percentages are by weight unless otherwise indicated.

Example 1

ALD alumina barrier coatings were deposited on nickel-copper (NiCu) atomized alloy powder 38% Ni 62% Cu ("Powder Cu-103," PRAXAIR®, Danbury, CT) using a continuous vibrating bed reactor similar to the disclosed in FIG. 1, except that it has three precursor dosing zones 28*a*, 28*b* and 28*c*, separated by two purge zones 18*a* and 18*b*. The dimensions of the reaction zone are 5.08 cm (2 inches) high×13.34 cm (5.25 inches) wide×60.96 cm (24 inches) long. Approximately 1,000 g of the NiCu alloy was loaded into a hopper on one side of the reactor. The NiCu is gravity-fed into the reactor through the hopper which is purged with $N_2$ to combat $O_2/H_2O$ infiltration into the entrance of the reactor. The NiCu alloy contacted support 12 and became uniformly distributed across the support 12 and moved towards the first dosing zone 28A. Operating pressure of the gas flow was <34.5 kPa (5 psi). A pneumatic linear vibrator was used at 345 kPa (50 psi).

The NiCu encountered the dosing zone 28A (trimethylaluminum, TMA) approximately 10.8 cm (4.5 inches) after entering the reactor. Dosing zone 28A is approximately 2.54 cm (1 inch) in length. TMA and nitrogen were fed from the below support 12 at a pressure approximately 1.5× the pressure of the atmosphere allowing the TMA to diffuse through support 12 and the particle bed. A near-zero negative pressure was applied above support 12 and particle bed 14, to remove an exhaust gas that contained excess TMA and reaction byproducts. The particles left the zone having a methylated monolayer with an aluminum center.

The particles were vibrationally translated a 12.7 cm (5-inch) length through nitrogen purge zone 18*a* to dosing zone 28*b*, where it was exposed to a water/nitrogen gas stream. At this point as the particles left dosing zone 28*b*, one complete cycle alumina-forming ALD had been performed on the surface of the particle. One additional half cycle of trimethylaluminum was applied to the particles in dosing zone 28*c* before the particles exited the reactor through a chute that prevented the particles from aerosolizing. The particles were collected in a hopper. The particles reacted with atmospheric water in the hopper to complete the second ALD cycle.

Nitrogen gas flow at the exit of the reactor was larger than the flow in the interior of the reactor to inhibit oxygen/$H_2O$ transmission into the reaction chamber.

The coated particles were passed through the apparatus multiple times to perform additional ALD cycles at their surfaces. Samples were pulled at different cycle times to measure the growth of the ALD film. The oxidative barrier properties of the applied film were measured. In each case, the results were similar to those obtained using a conventional batch-type ALD process.

Example 2

A proof of concept, 5.08-cm (2-inch) wide CVR was constructed of aluminum plates to create individual gas zones underneath a porous stainless steel deck. The deck plating and frame were silicon-glued together to form an airtight seal. A metal coil screw feeder delivered a constant flow of material into the reactor. Approximately 2,000 g of 5-micron electrolytic iron particles (AEE-Micron Metals) were loaded into the feeder hopper. It was determined through previous trials that the flow of material through the reactor was 240 g/min, which to coat the entire 2,000 g loaded, was 8.33 min/pass. The TMA gas flow rate at the manifold was set to a calculated 0.14 standard liters/min. After each 500-700 grams had passed through the reactor, it was reloaded into the hopper, using a recirculating continuous method; operation was never stopped. After each 8.33-minute interval had passed, a sample was collected. The ALD process ran for 283 minutes leading to a maximum of 68 ALD cycles. The total number of cycles were calculated from the previously established throughput (8.33 min/per 2 ALD cycles).

The coated iron samples were oxidized using thermogravimetric analysis. For iron samples with thicker coatings, the onset temperature of oxidation shifts to higher temperatures. These results are shown in Table 1. The rotary batch ALD sample of 50-cycles $Al_2O_3$ at 180° C. is shown as a benchmark. As seen in the table, the 46-cycle sample is oxidized at approximately the same temperature as the batch 50-cycle rotary sample.

TABLE 1

Oxidation Protection from ALD Coatings at 80° C. in Gen1 CVR

| Cycle | Temperature Onset (° C.) |
|---|---|
| 0 | 326.8 |
| 7 | 375.0 |
| 15 | 387.8 |
| 28 | 421.8 |
| 41 | 455.5 |
| 46 | 514.7 |
| 50 | 510.7* |
| 64 | 579.0 |
| 68 | 586.9 |

*Benchmark sample from batch rotary ALD system

Example 3

A second generation continuous vibrating reactor (CVR Gen 2) similar in the design of FIG. 4 was employed. The reactor was milled from a single block of 6061 aluminum housed a stainless steel porous sheet designed to fit into a milled recess. This eliminated the majority of sealing surfaces between the different gas zones. Mass flow controllers (0-2 standard liters per minute) (Alicat Scientific, Inc., Tucson, Arizona) were used to more accurately control gas flow into the system. Exhaust ports were located only directly over each precursor section, but flared to reduce gas velocity and reduce particle entrainment. Initial experiments were used to determine accurate gas separation and various seals were employed. VITON® synthetic rubber, aluminum, and copper were used to form an airtight seal in the reactor below the deck.

CVR Gen 2 was used to optimize balanced gas flow more than previous Gen 1. Gas flow through the reactor was particle dependent due to different surface areas and densities. Linear velocity of the particles and estimated bed height also factor in to the gas flow dynamics and can require trimethylaluminum heating to increase precursor concentration and ensure that the gas flow does not cause fluidization, spouting, or churning of the particles leading to particle loss. The exhaust flow was balanced with the incoming gas flow to ensure that byproducts and unreacted precursors were removed from the system without causing CVD on the particles or within the reactor.

Example 4

Using the experimental set up described in Example 3 using CVR Gen 2, approximately 1,810 g of 5 um electrolytic iron powder was loaded in the custom built screw-feeder. The speed of the particles translating through the reactor was 90 g/min which equates to 20 min/pass. The TMA gas flow rate at the manifold was calculated to require 0.14 l/min. Using a recirculated continuous method, after 95% of the material had passed through the reactor it was reloaded into the hopper. After each 20-minute interval, a sample was taken and the material was reloaded into the hopper. The ALD cycle was run for approximately 500 minutes leading to a maximum of 50 ALD cycles. The total number of cycles was calculated from 2 ALD cycles per 20-minute pass.

TABLE 2

| Oxidation Protection from ALD Coating at 180° C. in Gen2 CVR | |
|---|---|
| Cycle | Temperature Onset (° C.) |
| 0 | 324.6 |
| 10 | 395.6 |
| 20 | 400.4 |
| 30 | 428.3 |
| 40 | 482.5 |
| 50 | 515.03 |
| 50 | 510.7* |

*Benchmark sample from batch rotary ALD system

Figure 5:
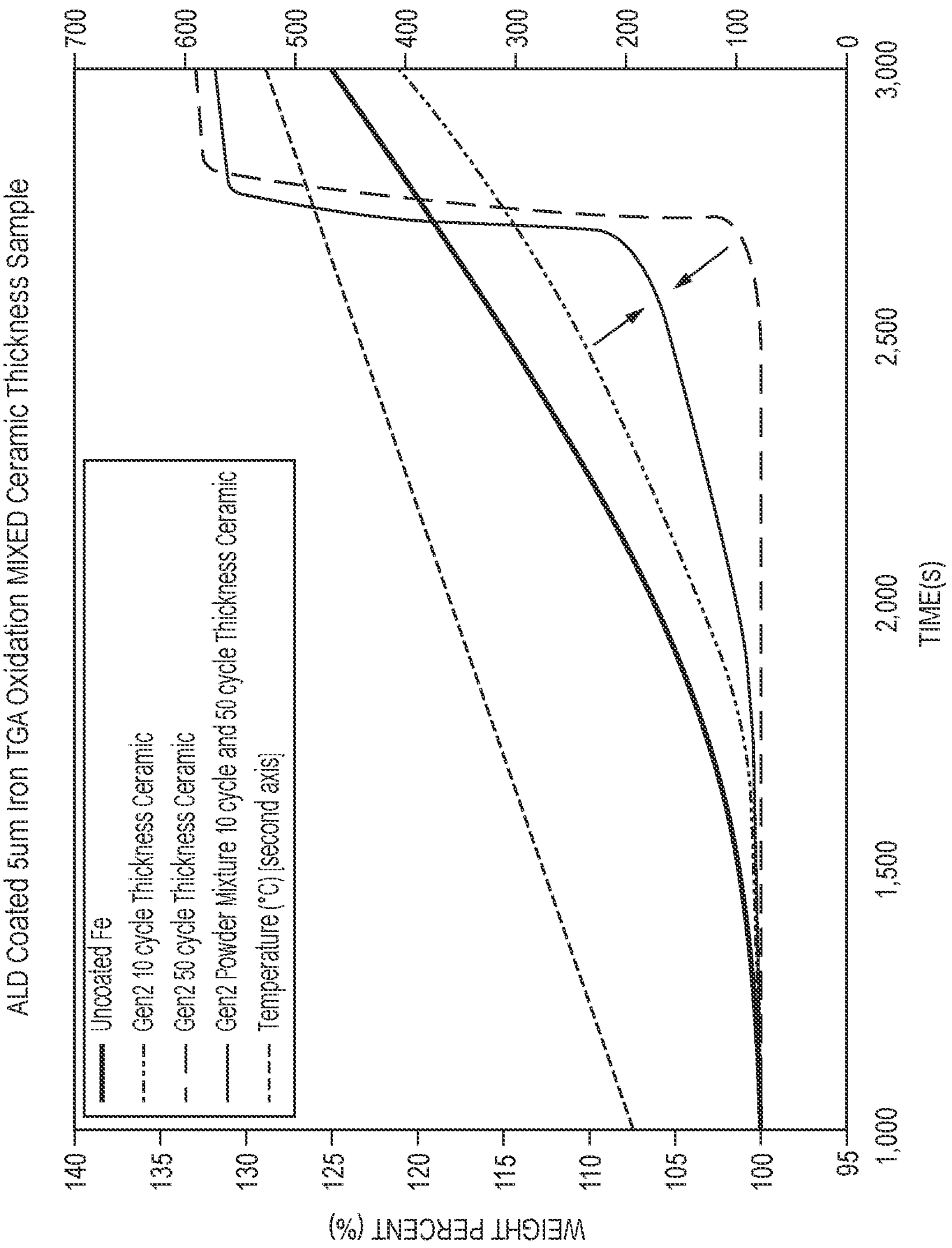
FIG. 5 is a plot displaying the results of an atomic layer deposition coated five-micron iron TGA oxidation mixed ceramic thickness sample performance.

The CVR Gen 2 results and a comparison to rotary performance is shown in Table 2. The onset temperature for the 50-cycle alumina run in CVR was approximately the same as for the 50-cycle alumina run in rotary. The shift in temperature followed a linear increase in temperature as well. It was theorized that when samples of the 10-cycle alumina and the 50-cycle alumina five-micron iron were mixed, one would see the initial oxidation occurring in the 10-cycle alumina coated iron, and then a rapid mass gain in when the 50-cycle alumina is oxidized, causing a shift in the onset oxidation temperature. In FIG. 5, the plot discloses a blend oxidation temperature of 455.0° C. This compares favorably to an average of the 10+50-cycle material independently, which had an onset temperature of 455.1° C. There were also two discrete oxidations occurring. The first oxidation was a slow onset, and for the second, a rapid oxidation occurred when the temperature reached 455.0° C. This can be seen in FIG. 5 at the point on the graph indicated by the two arrows disclosing ALD coated five-micron iron TGA oxidation mixed ceramic thickness sample performance.

The invention claimed is:

1. A method of performing atomic layer deposition or chemical vapor deposition on substrate particles in a particle bed, comprising a reactor apparatus comprising a reaction zone defined by:

more than one spatially separated precursor dosing zones adapted to operate simultaneously, a plurality of inert gas dosing zones positioned in alignment with the spatially separated precursor dosing zones, and adjacent to each of the spatially separated precursor dosing zones; and baffles between adjacent precursor dosing zones and inert gas dosing zones, and openings in the baffles located above the particle bed to allow fluid communication of the precursor and inert gases in a head space;

the method comprising:

a. moving and directing, by a method chosen from vibrational mode, pushing, gravitational force, and a combination thereof, the substrate particles in the particle bed through the reaction zone;

b. introducing a precursor gas into contact with the substrate particles in the particle bed at each precursor dosing zone, such that the precursor gas reacts at the surface of the substrate particles in said precursor dosing zone to form substrate particles with the atomic layer deposition or the chemical vapor deposition thereon said substrate particles;

c. collecting an exhaust gas from the head space containing at least one of the following: a purge gas, a carrier gas, unreacted precursor and a reaction by-product;

d. removing the exhaust gas from the head space; and wherein the inert gas dosing zones are configured to purge excess precursor gases.

2. The method of claim 1, which is operated under non-fluidizing conditions.

3. The method of claim 1, wherein the substrate particles in the particle bed are directed through the reaction zone by vibration.

4. The method of claim 1, wherein the particle bed is a porous particle bed and wherein the precursor gas is introduced below the substrate particles in the porous particle bed, and the precursor gas passes upwardly through the porous particle bed and into contact with the substrate particles.

5. The method of claim 1, wherein the substrate particles are moved continuously with a linear vibrating or a circular vibrating conveyance mechanism.

6. The method of claim 1, wherein said substrate particles are at least partially fluidized.

7. The method of claim 1, wherein the substrate particles are transported in the reactor apparatus by a slide, chute, or inclined tube.

8. The method of claim 1, wherein the substrate particles are oscillated, from one side of the reactor apparatus to the other side of the reactor apparatus.

9. The method of claim 1, wherein the substrate particles are moved in continuous circulation until removed from the reaction zone.

10. The method of claim 1, wherein the substrate particles descend or rise through spatially separated gas zones.

11. The method of claim 1, wherein an exhaust flow is balanced with incoming gas flow comprising precursor gas, as to prevent chemical reaction from the ingress or egress of the external atmosphere.

12. The method of claim 1, wherein gas flow in a particle region is laminar.

13. The method of claim 1, wherein the precursor gas is introduced at or above the moving porous particle bed.

14. The method of claim 1, wherein the substrate particles are last exposed to the precursor gas when the substrate particles enter into a collection hopper or a cooling tower.

15. The method of claim 1, wherein the atomic layer deposition or the chemical vapor deposition is performed in a continuous manner.

16. The method of claim 1, wherein the speed of the substrate particles through the reactor apparatus is adjusted to provide increased residence time in the reaction zone, and/or to temporarily stop movement of the substrate particles.

17. A method of performing atomic layer deposition or chemical vapor deposition on substrate particles in a particle bed, comprising a reactor apparatus comprising a reaction zone defined by:

more than one spatially separated precursor dosing zones adapted to operate simultaneously, a plurality of inert gas dosing zones positioned in alignment with the spatially separated precursor dosing zones, and adjacent to each of the spatially separated precursor dosing zones; and baffles between adjacent precursor dosing zones and inert gas dosing zones, and openings in the baffles located above the particle bed to allow fluid communication of the precursor and inert gases;

the method comprising:

a. moving and directing, by a method chosen from vibrational mode, pushing, gravitational force, and a combination thereof, the substrate particles in the particle bed through the reaction zone;

b. introducing a precursor gas into contact with the substrate particles in the particle bed at each precursor dosing zone, such that the precursor gas reacts at the surface of the substrate particles in said precursor dosing zone to form substrate particles with the atomic layer deposition or the chemical vapor deposition thereon said substrate particles;

c. collecting an exhaust gas from a head space containing at least one of the following: a purge gas, a carrier gas, unreacted precursor and a reaction by-product;

d. removing the exhaust gas from the head space;

wherein the inert gas dosing zones are configured to purge excess precursor gases; and wherein the substrate particles are first exposed to the precursor gas as the substrate particles enter into a feeder.

18. A method of performing atomic layer deposition or chemical vapor deposition on a battery material in a particle bed comprising a reaction zone defined by:

more than one spatially separated precursor dosing zones adapted to operate simultaneously, a plurality of inert gas dosing zones positioned in alignment with the spatially separated precursor dosing zones, and adjacent to each of the spatially separated precursor dosing zones; and baffles between adjacent precursor dosing zones and inert gas dosing zones, and openings in the baffles located above the particle bed to allow fluid communication of the precursor and inert gases in a head space;

the method comprising:

a. moving and directing, by a method chosen from vibrational mode, pushing, gravitational force, and a combination thereof, the battery material in the particle bed through the reaction zone;

b. introducing a precursor gas into contact with the battery material in the particle bed at each precursor dosing zone, such that the precursor gas reacts at the surface of the battery material in said precursor dosing zone to form battery material with the atomic layer deposition or the chemical vapor deposition thereon said battery material;

c. collecting an exhaust gas from the head space containing at least one of the following: a purge gas, a carrier gas, unreacted precursor and a reaction by-product;

d. removing the exhaust gas from the head space; and wherein the inert gas dosing zones are configured to purge excess precursor gases.

19. The method of claim 18, wherein the atomic layer deposition or the chemical vapor deposition is performed in a continuous manner.

* * * * *